US009786362B1

(12) United States Patent
Das et al.

(10) Patent No.: US 9,786,362 B1
(45) Date of Patent: Oct. 10, 2017

(54) MEMORY CIRCUIT AND DATA PROCESSING SYSTEM

(71) Applicant: ARM Limited, Cambridge (GB)

(72) Inventors: Shidhartha Das, Upper Cambourne (GB); David Michael Bull, Cambridge (GB); Pranay Prabhat, Cambridge (GB); Adeline-Fleur Fleming, Duxford (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/248,335

(22) Filed: Aug. 26, 2016

(51) Int. Cl.
*G11C 8/00* (2006.01)
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ............................ G11C 11/419; G11C 11/418
USPC ............................................ 365/154, 230.06
See application file for complete search history.

(56) References Cited

U.S. PATENT DOCUMENTS 5,946,241 A * 8/1999 Zink ...................... G11C 7/062 365/185.25
6,738,286 B2 * 5/2004 La Rosa ................ G11C 16/20 365/185.01
2005/0078514 A1 * 4/2005 Scheuerlein ............. G11C 8/10 365/185.05
2005/0190625 A1 * 9/2005 Matsuzaki ........... G11C 7/1045 365/222
2007/0195631 A1 * 8/2007 Hoffmann ................ G11C 7/06 365/230.03
2011/0026314 A1 * 2/2011 Hamouche ............... G11C 7/12 365/156

* cited by examiner

*Primary Examiner* — Viet Q Nguyen
(74) *Attorney, Agent, or Firm* — Pramudji Law Group PLLC; Ari Pramudji

(57) ABSTRACT

A memory circuit comprises an array of data storage elements; access circuitry to access a data bit, stored by a data storage element enabled for access, by an access signal for that data storage element; and control circuitry to enable groups of data storage elements for access, the groups having a group size, the group size being one or more, the access signals for data storage elements in a group being combined to provide a combined access signal common to that group of data storage elements; the control circuitry being configured to selectively operate in at least a first mode and a second mode, the group size in the first mode being different to the group size in the second mode.

18 Claims, 12 Drawing Sheets

MEMORY CIRCUIT AND DATA PROCESSING SYSTEM

BACKGROUND

This disclosure relates to memory circuits and data processing systems.

Some data processing systems may be designed or required to operate at different supply voltages.

In the case of memory circuits, many designs of memory element depend upon detecting a read signal and differentiating whether the read signal is indicative of a stored logical 1 or a stored logical 0. As the supply voltage decreases, in the absence of techniques to alleviate these problems, the operation of the memory circuit can become less reliable. Faults or incorrect operation can occur on either or both of the memory read and the memory write operations.

One approach which aims to provide more reliable operation of voltage scalable memory circuits is to modify the design of the memory element or the basic bit cell architecture such as a so-called 6T (6 transistor) static random access memory (SRAM) cell by incorporating additional transistors. For example, these extra transistors can serve the purpose of avoiding a contention between read- and write-accesses as in an 8T architecture or providing improved crosspoint selection so as to avoid a so-called read-disturb during unselected write accesses, as in a 10T architecture.

The 6T cell is an established architecture and fabrication techniques have been developed to allow efficient layout and fabrication of arrays of 6T cells and, once fabricated, efficient operation and power consumption of the arrays. The term "foundry optimised" is sometimes used to refer to such 6T cells. This colloquial term in the art does not imply that such 6T layouts are perfect, but instead refers to the relative level of sophistication of the established 6T designs in comparison to some other bit cell designs. However, the 6T cell has lower capabilities for voltage scalable operation than other cell designs using more transistors. Having said that, each of the modifications mentioned above requires bespoke non-foundry-optimised bit cells that can potentially add area and/or power overheads and can require more work in their layout.

SUMMARY

In an example arrangement there is provided a memory circuit comprising:

access circuitry to access a data bit, stored by a data storage element enabled for access, by an access signal for that data storage element; and control circuitry to enable groups of data storage elements for access, the groups having a group size, the group size being one or more, the access signals for data storage elements in a group being combined to provide a combined access signal common to that group of data storage elements;

the control circuitry being configured to selectively operate in at least a first mode and a second mode, the group size in the first mode being different to the group size in the second mode.

In another example arrangement there is provided a memory circuit comprising:

an array of data storage elements;

accessing means for accessing a data bit, stored by a data storage element enabled for access, by an access signal for that data storage element; and control means for enabling groups of data storage elements for access, the groups having a group size, the group size being one or more, the access signals for data storage elements in a group being combined to provide a combined access signal common to the group of data storage elements;

the control means being operable to selectively operate in at least a first mode and a second mode, the group size in the first mode being different to the group size in the second mode.

In another example arrangement there is provided a method comprising:

enabling groups of data storage elements of an array of data storage elements for access, the groups having a group size, the group size being one or more;

combining access signals for data storage elements in a group to provide a combined access signal;

accessing a group of data storage elements by a common access signal for data storage elements of the group; and selectively executing the enabling, combining and reading steps in at least a first mode and a second mode, the group size in the first mode being different to the group size in the second mode.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Figure 1:
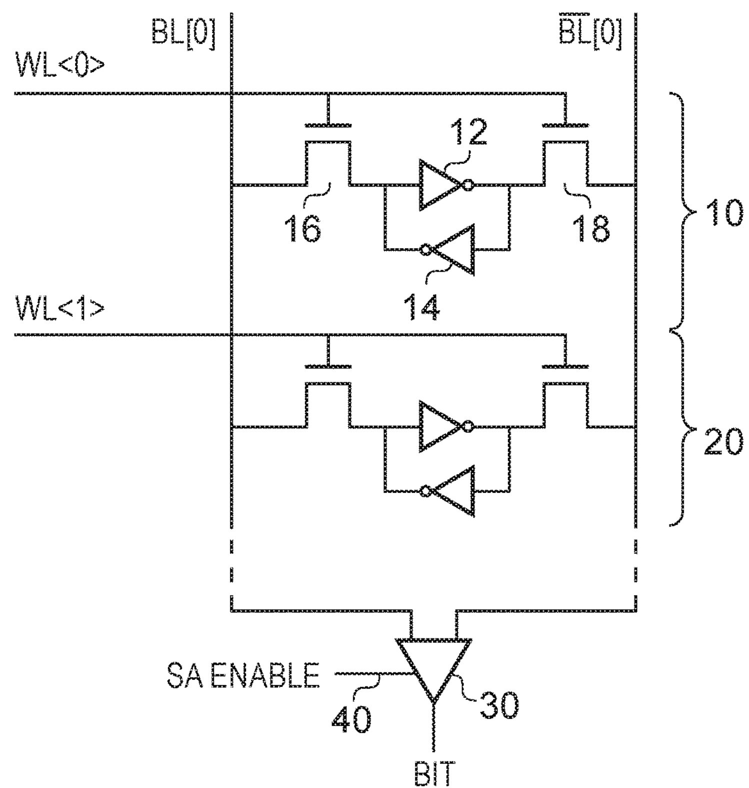
FIG. 1 schematically illustrates a memory circuit.

Before discussing the embodiments with reference to the accompanying figures, the following description of embodiments is provided.

An example embodiment provides a memory circuit comprising:

an array of data storage elements;

access circuitry to access a data bit, stored by a data storage element enabled for access, by an access signal for that data storage element; and control circuitry to enable groups of data storage elements for access, the groups having a group size, the group size being one or more, the access signals for data storage elements in a group being combined to provide a combined access signal common to that group of data storage elements;

the control circuitry being configured to selectively operate in at least a first mode and a second mode, the group size in the first mode being different to the group size in the second mode.

The present disclosure provides a technique for operating an array of memory elements in groups of one or more elements, according to at least two modes of operation having different group sizes (for example, the group size in the second mode could be greater than that in the first mode). The memory elements in a group are enabled for read and/or write access together, and in examples read signals from the memory elements in a group, or write signals to memory elements in a group, or both are combined for detection by read circuitry. Increasing the group size can provide a more reliable operation at lower supply voltages.

In this way, for example, with a lower group size (such as, for example, a group size of one) the memory circuit can provide a higher capacity for use at higher supply voltages. At lower supply voltages, a different mode and different group size can be used, providing a lower memory capacity but allowing a more reliable operation at the lower supply voltage.

In examples, this arrangement can be achieved while still using a standard 6T cell design as discussed above. There is no need to modify the individual cell design, but instead the way in which cells are accessed is changed as between one mode of operation (one group size) and another mode of operation (another group size). The development and physical layout of memory circuits according to this arrangement can be simpler than would be the case were a different bit cell to be used, in that in some examples the modifications to the circuitry can be in other areas (such as decoding) which are not part of the array of memory elements itself.

Various group sizes can be used. For example, the group size can be common to multiple groups (or indeed to all accesses to the memory circuit taking place at that particular time). Different numbers of modes (for example, more than two modes) can be used. For example, the group size in the second mode could be greater than in the first mode. In an example, the group size is one in the first mode (which can provide a maximum capacity of one bit per memory element), and the group size is greater than one in the second mode. For example, the group size could be 2, 4 or another value in the second mode.

Where a group size of greater than one is in use, it can be appropriate to arrange for the same data bit value to be written to each memory element in a group so as to provide consistency when the memory elements in that group are subsequently read. In examples, this can be achieved by the access circuitry comprising write circuitry configured to write a data bit to a data storage element by providing a write signal to that data storage element; and the control circuitry being configured, in respect of a write operation to write a data bit to a given data storage element, to control writing of that data bit to all of the data storage elements in the group containing the given data storage element.

The grouping of memory elements can be achieved in various ways. One example technique uses a variation in an address decoding operation to implement the grouping. In examples, the memory circuit comprises address decoding circuitry to map data storage elements to memory addresses, the address decoding circuitry and the control circuitry cooperating, in a mode of operation having a group size greater than one, to map each group of data storage elements to the same memory address.

It is not a requirement to implement a linkage between power supply voltage and mode or group size. However, it can be useful if such an association is in place, for example according to a circuit in which the control circuitry is configured to operate in the first mode or the second mode in dependence upon a power supply voltage provided to the circuit. For example, the control circuitry can be configured to operate in the second mode in response to a lower power supply voltage and to operate in the first mode in response to a higher power supply voltage.

The techniques are usefully applicable to memory read operations, in which case the access circuitry may comprise read circuitry configured to read a data bit stored by a data storage element by detecting a read signal output by that data storage element; and for a group of data storage elements enabled for access, the read signals output by data storage elements in the group can be combined to provide a combined read signal for detection by read circuitry common to the group of data storage elements.

A transition from one mode to another can be facilitated by the control circuitry being configured, in response to initiation of a transition from the first mode to the second mode, to control copying of data bits stored by some of the data storage elements so that, for each group of data storage elements in the second mode, the data storage elements of the group store the same data bit. This arrangement can allow continued operation across a mode change without requiring a loss of data in at least those memory areas which will still be validly addressable after the mode change.

In another arrangement, for example applicable to a cache memory or similar arrangement in which the data storage elements are associated with information indicating whether valid data is currently stored by those data storage elements, the control circuitry is configured, in response to initiation of a transition in which the group size changes, to set the associated information to indicate that valid data is not currently stored by the data storage elements. In this way, in response to a mode change the stored data is invalidated so that incorrect data is not read and used.

In examples, the read signal is a differential signal; and the read circuitry comprises a sense amplifier configured to detect a data bit in response to the differential signal.

In some examples, such as examples relating to at least some types of static RAM cells, the circuit may comprise a first array of control lines (such as so-called word lines) connected to the array of data storage elements, by which a control line of the first array of control lines enables a respective subset of the data storage elements; and a second array of control lines (such as so-called bit lines) to connect a given access circuitry to a plurality of data storage elements comprising a data storage element in each subset so as to connect that given access circuitry to data storage elements in the plurality of data storage elements. in such examples, the control circuitry is configured to enable a group of data storage elements for access by asserting two or more control lines (such as word lines) of the first array.

The plurality of data storage elements enabled in this way can form a group of data storage elements as previously discussed.

Although in some examples just a first and a second mode may be envisaged, in other examples the control circuitry is configured to operate in three or more modes each having a different respective group size.

A memory circuit as defined above can be useful in a data processing system comprising: such a memory circuit; and a power controller configured to provide a power supply voltage to the circuit, and to provide a mode indication, indicative of the first mode or the second mode, to the control circuitry, in dependence upon the power supply voltage. The power controller could, for example, set a power supply voltage itself, or it could act in response to a detection of a power supply voltage (for example, a voltage available from an external power source).

In the context of a group of data storage elements such as a group of two or more data storage elements, the manner in which the read signals are supplied to common read circuitry allows the use of detection circuitry to detect instances of discrepancies between data bits stored by data storage elements in a group of data storage elements. A discrepancy can indicate that one or more data storage elements in the group is operating incorrectly or imperfectly, and therefore potentially that the current operating voltage should be increased in order to improve reliability of operation of the memory circuit. Therefore, in such instances, the power controller may be configured to control the operating voltage of the circuit in dependence upon the instances of discrepancies detected by the detection circuitry.

If such a discrepancy exists, there might be a conflict between contributions to the read signal provided by data storage elements in the group, which could mean that the time taken for the read signal to reach an unambiguous state for detection by the read circuitry can be longer than in a situation where a discrepancy does not exist. Therefore, in examples, the access circuitry of the memory circuit comprises read circuitry and the detection circuitry is configured to detect a time taken for the read circuitry to read a data bit. In some examples, the detection circuitry is configured to detect the polarity of a data bit generated by the read circuitry differs between a first instant after initiation of a read operation and a second, later, time instant after initiation of the read operation. In examples, detections at further instants may also be made.

Another example embodiment provides a memory circuit comprising:

an array of data storage elements;

accessing means for accessing a data bit, stored by a data storage element enabled for access, by an access signal for that data storage element; and control means for enabling groups of data storage elements for access, the groups having a group size, the group size being one or more, the access signals for data storage elements in a group being combined to provide a combined access signal common to the group of data storage elements;

the control means being operable to selectively operate in at least a first mode and a second mode, the group size in the first mode being different to the group size in the second mode.

Another example embodiment provides a method comprising:

enabling groups of data storage elements of an array of data storage elements for access, the groups having a group size, the group size being one or more;

combining access signals for data storage elements in a group to provide a combined access signal;

accessing a group of data storage elements by a common access signal for data storage elements of the group; and selectively executing the enabling, combining and reading steps in at least a first mode and a second mode, the group size in the first mode being different to the group size in the second mode.

Referring now to the drawings, FIG. 1 schematically illustrates a part of a memory circuit. In particular, FIG. 1 shows two static random access memory (SRAM) cells (otherwise referred to as data storage elements) 10, 20. Each of the cells is a six transistor (6T) cell, having a pair of cross-coupled inverters 12, 14 (each of which is formed of two transistors) along with two further transistors 16, 18.

A word line (WL) controls access to the contents stored by each memory cell in FIG. 1. In the drawing, a word line WL (0) is provided for the memory cell 10 and a word line WL (1) is provided for the memory cell 20. When the respective word line is asserted, the transistors 16, 18 of that cell are turned on, connecting the cross-coupled inverters 12, 14 to bit lines (BL).

Each cell is connected to a pair of bit lines BL(0) and $\overline{\text{BL}}$(0) respectively. The bit lines are complementary (as represented by the bar over the label $\overline{\text{BL}}$(0)) so that as one bit line of the pair tends towards a particular binary state, the other tends towards the other binary state.

This therefore provides an example of a first array of control lines (such as word lines) connected to the array of data storage elements, by which a control line of the first array of control lines enables a respective subset of the data storage elements; and a second array of control lines (such as bit lines) to connect a given access circuitry (for example, read circuitry and/or write circuitry) to a plurality of data storage elements comprising a data storage element in each subset so as to connect that given access circuitry to data storage elements in the plurality of data storage elements (for example, so that read signals output by data storage elements in the plurality of data storage elements are provided to that read circuitry). The plurality of data storage elements referred to here may form a group as discussed below.

To write to a memory cell, the word line is asserted and either of the two complementary bit lines is asserted (which may in fact involve being driven low, depending on the design) to allow writing of a logical zero or a logical one. In such arrangements the access circuitry can comprise write circuitry configured to write a data bit to a data storage element by providing a write signal to that data storage element.

To read from a cell, the word line is asserted and the voltages on the bit lines are detected by a sense amplifier (SA) 30 operating under the control of a sense amplifier enable signal 40. In the case of complementary bit lines, the sense amplifier 30 can be, for example, a differential amplifier responsive to one of the bit lines tending towards a lower voltage in response to the prevailing contents held by the cross-coupled inverters 12, 14. In these examples, the read signal is a differential signal; and the read circuitry comprises a sense amplifier configured to detect a data bit in response to the differential signal.

Figure 2:
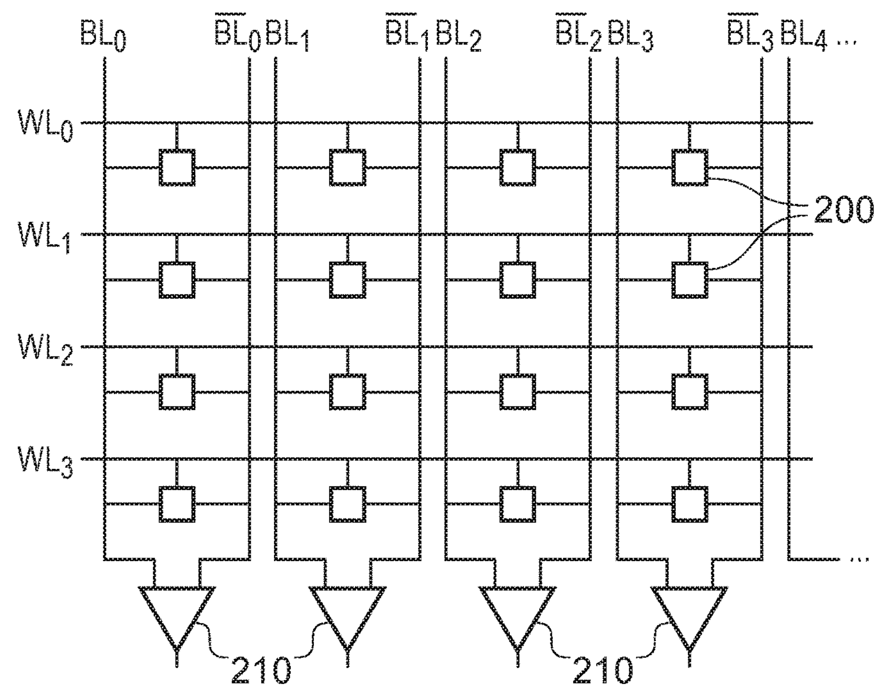
FIG. 2 schematically illustrates an array of data storage elements.

The arrangement of FIG. 1 shows only a pair of memory cells. The skilled person will understand that a typical memory device may have a large array of such memory cells, for example comprising plural rows and plural columns of data storage elements. FIG. 2 schematically illustrates such an array in which each memory cell is indicated by a schematic block 200. The memory cells are arranged in a rectangular array such that rows of memory cells have a word line in common, and columns of memory cells share pairs of complementary bit lines and respective sense amplifiers 210. Of course, the representation as rows and columns is merely for convenience of the description and does not have to relate to a particular layout or orientation of a device either in fabrication or in use.

In the array of FIG. 2, when operating in a conventional mode of operation, an access operation is initiated by a single row of memory cells being enabled by asserting a particular word line (or in other words control lines in the first array are configured to enable rows of data storage elements). The contents of one or more memory cells or that row of memory cells can then be accessed (written to or read from) via the bit lines (or in other words control lines in the second array of control lines are associated with columns of the data storage elements). So, in this mode of operation, even though the bit lines are shared between multiple memory cells in a column, only the relevant row of memory cells enabled by the word line is connected (by the transistors 16, 18 of the relevant cells) to the respective bit lines for access.

Figure 3:
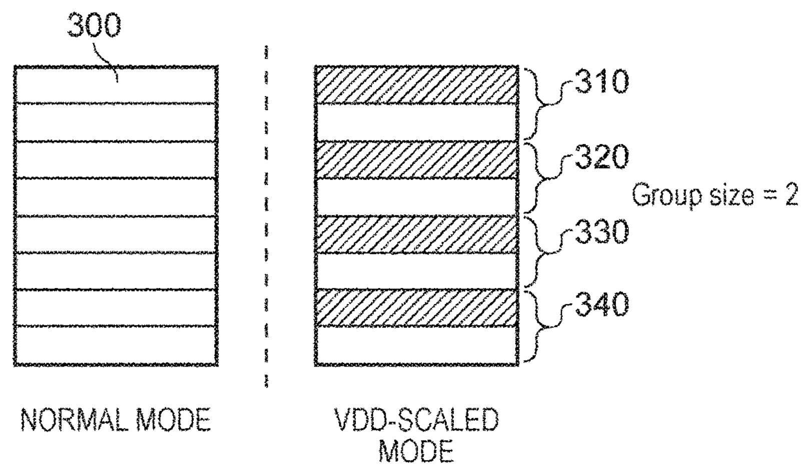
FIGS. 3 and 4 schematically illustrate operation in first and second modes.
Figure 4:
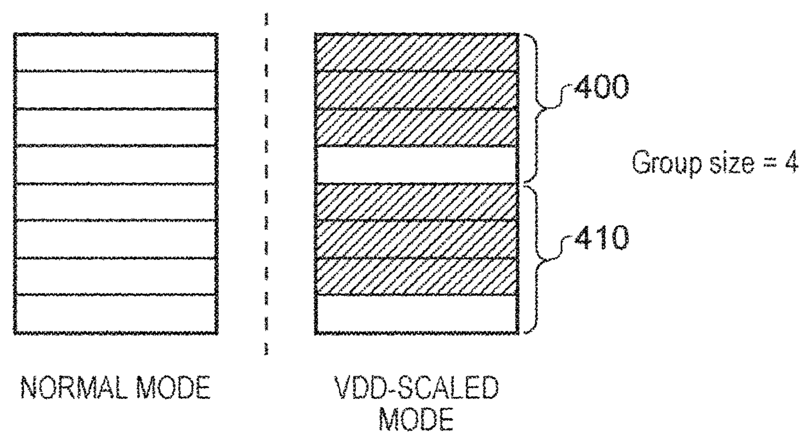

Alternative modes of operation of an array such that shown in FIG. 2 will now be described. FIGS. 3 and 4 schematically illustrate operation of such an array in different respective "modes". Here, a mode is associated with a group size, which will be explained further below.

In a mode in which the group size is greater than 1, an access operation to the array of memory cells involves enabling two or more (the number being equal to the group size) of the memory cells connected to common bit lines for access at the same time. In, for example, a read operation, the connection to the common bit lines means that the read signals output by memory cells in the group are combined to provide a combined read signal for detection by read circuitry (such as a sense amplifier) common to that group of memory cells.

One way in which this can be achieved is that multiple word lines are asserted, so that in each column of memory cells as drawn in FIG. 2, multiple memory cells are simultaneously enabled for access and, in an example read operation, are connected to the respective complementary bit lines.

Such an arrangement can be useful, for example in a lower voltage mode of operation.

The minimum operating voltages for SRAM can be considered separately for read, write and retain operations. Each type of operation has a respective lowest operating voltage.

Retention refers to simply retaining a currently held data bit in the absence of read or write operations. Typically, the lowest retention voltage is lower than a lowest voltage required for read or write operations. Therefore, a constraint on low voltage operation may relate to read and write operations rather than retention.

The performance of a write operation at low supply or operating voltages can be improved using so-called write-assist techniques. Several such techniques have been proposed such as so-called word line boosting, bit line boosting, bit cell supply reduction and the like. A combination of one or more write-assist techniques can provide appropriate write operation performance at low supply voltages. It is assumed for the purposes of the present description that one or more such techniques may be employed in the memory circuits under discussion; these are not explicitly shown in the diagrams because the present description relates primarily to techniques to provide potentially improved read operations at low operating or supply voltages.

Referring to FIG. 3, an array of memory cells has been simplified for the purposes of this drawing such that each row of memory cells similar to the rows shown in FIG. 2 is represented by a respective horizontal rectangle 300. Each row is enabled by a respective word line and can contain multiple memory cells in respective columns.

In a so-called "normal" mode of operation (an example of a first mode) in which the group size is one, an access to the array of memory cells involves enabling one word line and one corresponding row of memory cells. The contents of one or more of the memory cells in that row are accessed (read from or written to) via the bit lines appropriate to that column.

In contrast, in a so-called VDD-scaled mode (an example of a second mode) shown to the right hand side of FIG. 3, the rows of memory cells are arranged as groups of two rows such as groups 310, 320, 330, 340 such that access to a row of memory cells actually involves enabling two adjacent (in this example) rows for access. The cross-coupled inverters of the memory cells of the two rows in a group are connected to the bit lines for that column and are accessed together. This provides an example of the control circuitry being configured to enable a group of data storage elements for access by asserting two or more control lines of the first array.

A mode size of greater than one could be implemented by any of: (i) forming or enabling a group of memory cells in two or more columns but the same row; (ii) forming or enabling a group of memory cells in two or more rows but the same column; (iii) forming or enabling a rectangular group of memory cells over two or more columns and two or more rows; (iv) forming or enabling a group of memory cells across different rows and/or columns; or (v) forming or enabling other groups of memory cells.

The operation on the right hand side of FIG. 3 is referred to in this example as a VDD-scaled mode because it can be useful in a situation where the supply or operating voltage for the memory circuit (referred to in this example as VDD) is lower than in the case of the operation on the left hand side of FIG. 3. In the VDD-scaled mode of FIG. 3, the memory circuit is operating at half its capacity in the "normal" mode, but the effect of enabling a group of two (in this example) memory cells on each pair of bit lines is a potential doubling of the read current from the memory cells as supplied to the common sense amplifier during a read access. This can lead to the voltage on the appropriate bit line being driven low (to allow reading of the group of cells) more quickly and/or more reliably than in the situation of a single memory cell being read at the lower VDD value.

In this way, the use of this technique can potentially provide a substantial improvement in performance at a low VDD, and/or allow operation at a lower VDD than would otherwise be the case, while still being able to use so-called "foundry-optimised" 6T memory cells as discussed above. Of course the techniques are not limited to the use of 6T SRAM cells, and other options will be discussed below. But the techniques allow the use of 6T cells while still providing a potential improvement in performance and/or lowest VDD. Also, in a system in which VDD can vary, for example between a full power mode of operation and a power-saving mode of operation, the same memory circuit can be arranged to operate in each of these situations using different respective group sizes, with a larger group size being applicable to a lower voltage operation.

In these example, the access circuitry comprises read circuitry configured to read a data bit stored by a data storage element by detecting a read signal output by that data storage element; and for a group of data storage elements enabled for access, the read signals output by data storage elements in the group are combined to provide a combined read signal for detection by read circuitry common to the group of data storage elements.

FIG. 3 represents a group size of two for so-called VDD-scaled operation (and therefore provides an example of an arrangement in which the group size is one in the first mode, and the group size is greater than one in the second mode, and similarly an example in which the group size is greater in the second mode than in the first mode).

FIG. 4 represents a similar arrangement with a group size of four in which groups 400, 410 are accessed together by enabling sets of four word lines. In some examples, the control circuitry is configured to operate in three or more modes each having a different respective group size.

In FIGS. 3 and 4 the rows or word lines which are associated together to form one of the groups are adjacent in the array. This is not a requirement and in an alternative, for example, every nth word line could be enabled in a system having a group size of n.

One use of this type of arrangement is in connection with power management circuitry such that a larger group size can be established for use with a lower supply voltage to the memory circuitry.

Figure 5:
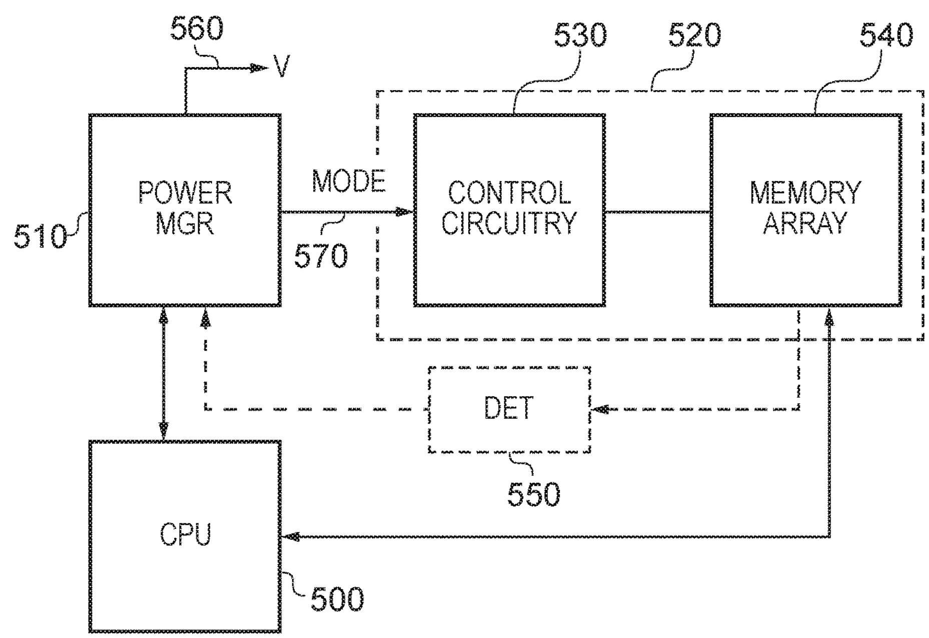
FIG. 5 schematically illustrates a data processing system.

FIG. 5 schematically illustrates a data processing system providing an example of this type of arrangement. In FIG. 5, a processing element or central processing unit (CPU) 500 is provided along with a power manager device 510, and a memory circuit 520 comprising control circuitry 530 and a memory array 540 of memory cells. A detector 550 is optionally provided (and may be part of the overall system or of the memory circuit 520). The purpose of the detector will be discussed below; in the following description of a basic operation the detector is not used.

The power manager 510 sets a supply voltage 560 representing the supply voltage for the memory circuitry 520 and the CPU 500, and optionally other components in the system. Power management can be used for various purposes, but an example is that when the load on a CPU is currently light, which is to say there are few processing tasks requiring operations by the CPU 500, the CPU voltage can be lowered in order to save power consumption by the system. This can be particularly relevant for battery powered systems. In such circumstances the power manager 510 can operate under software control, which is to say in response to instructions executed by the CPU 500.

As well as setting the voltage 560, the power manager also provides a mode indication 570 to the control circuitry 530, for example so that which the control circuitry is configured to operate in the first mode or the second mode in dependence upon a power supply voltage provided to the circuit. In examples, the control circuitry is configured to operate in the second mode in response to a lower power supply voltage and to operate in the first mode in response to a higher power supply voltage. In examples, the mode indication can specify or indicate a mode applicable to the whole memory circuit, or in other examples, to a section or partition of it.

The control circuitry 530 controls interaction with the memory array 540 so as to enable groups of one or more data storage elements for access. As discussed above, when a group of multiple data storage elements is simultaneously enabled for access the read signals output by data storage elements in the group are combined to provide a combined read signal for detection by read circuitry common to the group of data storage elements.

In examples, the power manager 510 can set a mode having a larger group size in response to a change in the voltage 560 from a higher supply voltage to a lower supply voltage.

FIG. 5 therefore provides an example of a memory circuit 520 comprising: an array 540 of data storage elements; access circuitry to access a data bit, stored by a data storage element enabled for access, by an access signal for that data storage element (such as read circuitry 210 to read a data bit stored by a data storage element by detecting a read signal output by that data storage element in response to that data storage element being enabled for read access); and control circuitry to enable groups of data storage elements for access, the groups having a group size, the group size being one or more, the access signals for data storage elements in a group being combined to provide a combined access signal common to that group of data storage elements (such as control circuitry 530 to enable groups of one or more data storage elements for access, the read signals output by data storage elements in a group being combined to provide a combined read signal for detection by read circuitry common to the group of data storage elements); the control circuitry being configured to selectively operate in at least a first mode and a second mode, the group size in the first mode being different to the group size in the second mode. FIG. 5 also provides an example of a data processing system comprising: a memory circuit 520 as discussed above; and a power controller 510 configured to provide a power supply voltage to the circuit, and to provide a mode indication, indicative of the first mode or the second mode, to the control circuitry, in dependence upon the power supply voltage.

Figure 6:
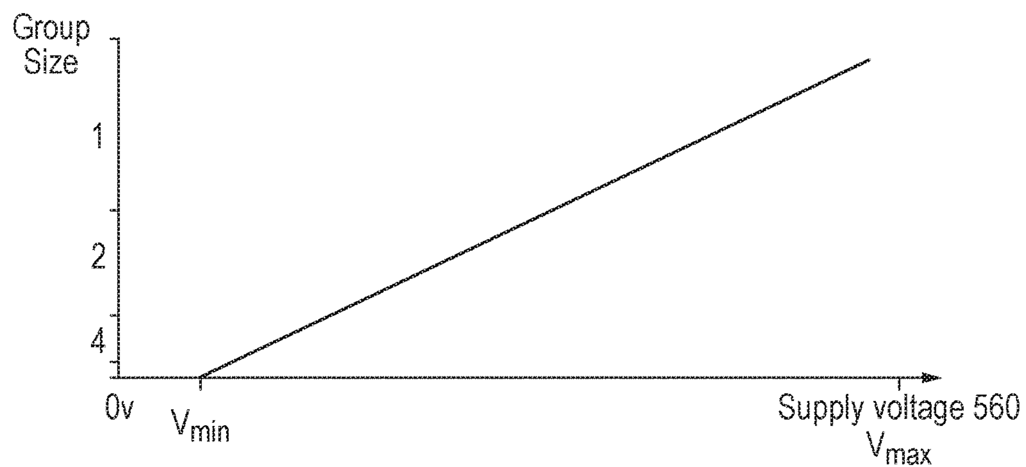
FIG. 6 is a schematic graph relating group size to supply voltage.

The relationship between supply voltage 560 and the group size/mode can be established according to a look-up table, for example, or other design parameters. FIG. 6 is a schematic example graph relating group size to supply voltage in which, for any supply voltage 560 above a minimum supply voltage $V_{min}$ below which the circuitry cannot operate at all, is associated with a respective group size. In the example of FIG. 6, a reduction in supply voltage from a highest supply voltage shown ($V_{max}$) by a factor of approximately 50% causes the group size to be changed by the power manager from a group size of one to a group size of two. A further reduction causes the power manger to change to a group size of four and so on.

Figure 7:
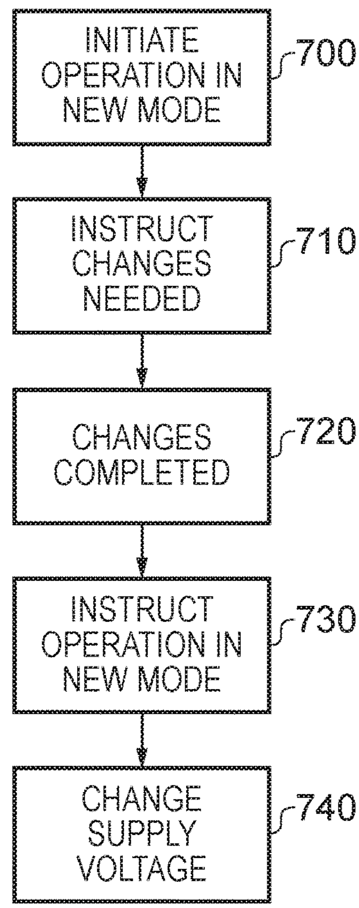
FIG. 7 is a schematic flowchart illustrating operations relating to a change in supply voltage.

FIG. 7 is a schematic flow chart illustrating operations relating to a change in supply voltage. In the example of FIG. 7, the change in supply voltage results in a change in group size or, in other words, a change in operation mode.

At a step 700, the power manager initiates operation in the new mode (which may be, but does not have to be, under the control of the CPU 500). At a step 710, the power manager 510 or the CPU 500 instruct any changes needed by the control circuitry 530 in response to the change in mode. Examples of such changes will be discussed below. In general terms, as discussed below, the more significant changes are needed in response to an increase in group size. Since such changes correspond to a reduction in supply voltage, the changes are carried out at the higher supply voltage (for greater reliability, speed or both, and/or because some of the operations associated with the changes may not be able to be carried out at the lower supply voltage) before the supply voltage is reduced. Accordingly, when the changes have been completed at a step 720 the CPU 500 and/or the power manager 510 instructs operation in the new mode at a step 730 and, at a step 740 the supply voltage 560 is changed to the new, lower, supply voltage.

Figure 8:
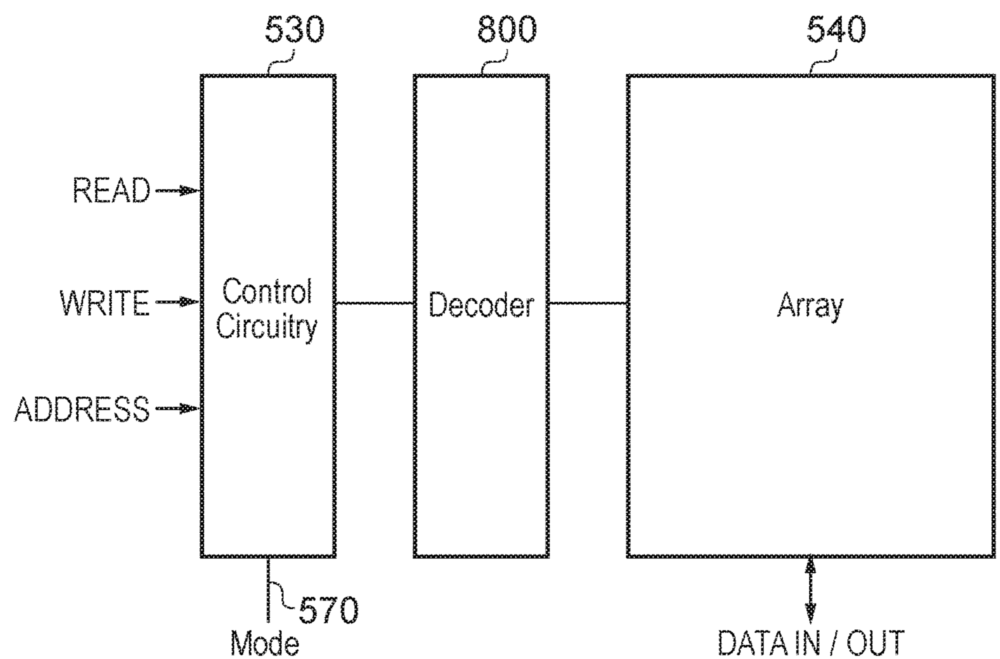
FIGS. 8 and 9 schematically illustrate memory circuits.
Figure 9:
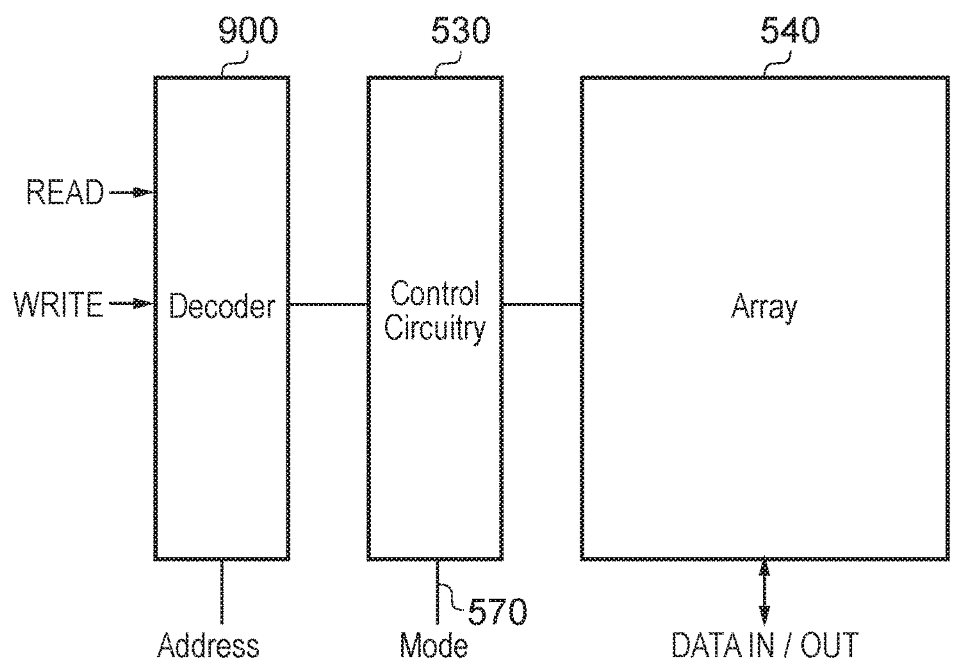

FIGS. 8 and 9 schematically illustrate memory circuits.

In a memory circuit, an array of memory cells is typically provided (as described with reference to the preceding Figures) and in order to allow the memory cells to be addressed by (for example) the CPU 500, an address decoder is generally provided which converts a memory address into various enable signals to enable the appropriate word lines and sense amplifiers. Different ways in which such a decoder can interact with the control circuitry 530 will now be discussed.

In FIG. 8, the control circuitry 530 is responsive to a mode indication 570 from the power manager 510 and to an address indication, for example from the CPU 500. Read and write signals are also provided which can be passed via the decoder to the array 540.

The arrangement of FIG. 8 is such that the decoder 800 receives control signals via the control circuitry 530. When operation in a mode having a group size of greater than one is required, the control circuitry 530 modifies the control signals such as address information as passed to the decoder 800 so as to cause the decoder 800 to enable the multiple groups of memory elements as required under the current mode indicated by the mode signal 570. So, in examples, the decoder 800 could in principle be unchanged with respect to a decoder for use in a memory circuit having only a single mode of operation in which the group size is one.

Figure 10:
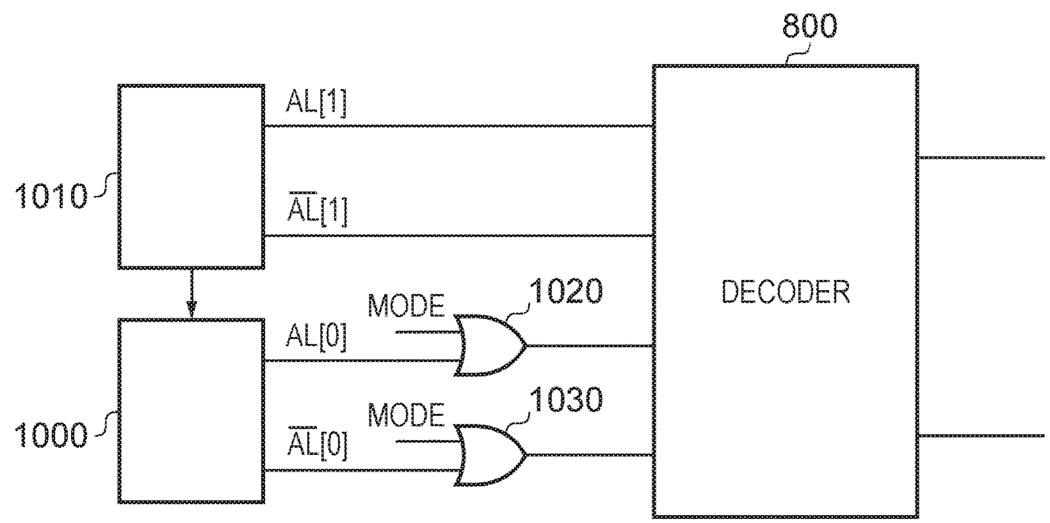
FIGS. 10 and 11 schematically illustrate circuitry to apply a mode signal.

FIG. 10 provides a simplified circuit example of the arrangement of FIG. 8 in which the control circuitry 530 comprises an address latch 1000 to latch a first memory address bit (AL(0)), a second memory address (AL(1)) bit being held by an address latch 1010. The first memory address bit AL(0) is either provided to the decoder as-is (without alteration), or both its true and inverted versions are set to 1 under the control of a mode indication (1 or 0) and a set of OR gates 1020, 1030.

In this simplified arrangement, if the mode indication provided to the OR gates 1020, 1030 is 0, then the memory address bit AL(0) is passed to the decoder 800 as-is. In that case, the decoder responds to the memory address bits held by the latches 1000, 1010. On the other hand, if the mode indication provided to the OR gates 1020, 1030 is 1, then the memory address bit AL(0) is ignored, so that the decoder 800 enables two sets of word lines corresponding to the memory address AL(1).

Figure 11:
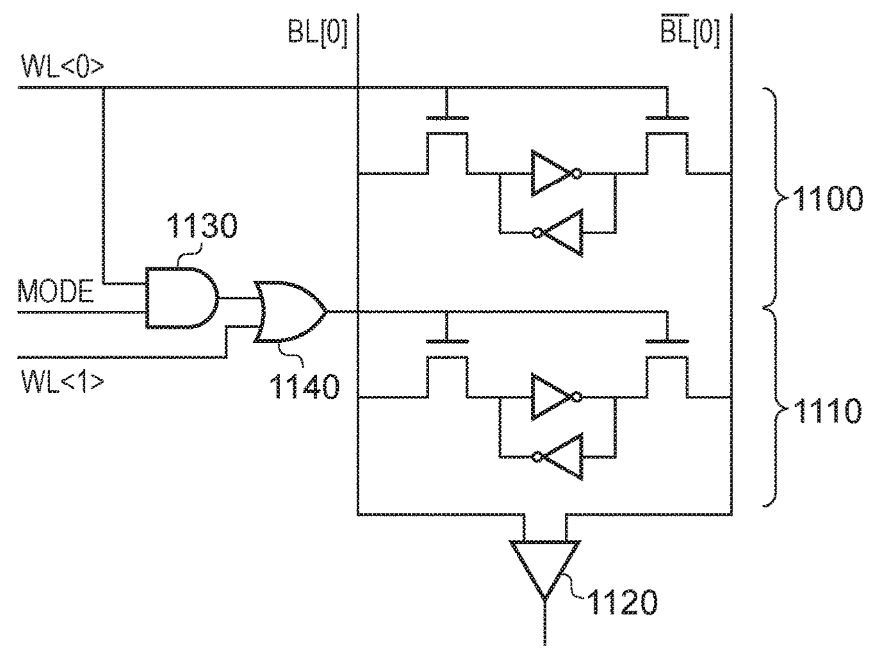

Returning to FIG. 9, in another arrangement the control circuitry 530 is disposed between the decoder 900 and the array 540 of memory cells so that, in response to the mode indication 570 the control circuitry acts to change (if required, according to the selected mode) the word lines and other control signals output by the decoder 900. An example of this type of operation is provided in a schematic form in FIG. 11 in which two memory cells 1100, 1110 are schematically shown in a simplified array. The memory cell 1100 is enabled by a word line WL(0) and the memory cell 1110 is enabled by a word line WL(1). The two memory cells are connected to common bit lines which in turn are connected to a common sense amplifier 1120.

The mode signal, which in this simplified example is either a 0 (for a "normal" mode in which the group size is one), or 1 (for a VDD-scaled mode in which the group size is two) is supplied to an AND gate 1130 where it is combined with the word line signal WL(0). So, the output of the AND gate 1130 is a logical 1 if the mode signal is 1 and the word line WL(0) is asserted. That output of the AND gate 1130 is combined by an OR gate 1140 with the word line WL(1) to provide the signal to enable the second memory cell 1110. Therefore, the memory cell 1110 is enabled if either (a) the decoder asserts WL(1) in the normal mode having a group size of one; or (b) the decoder 900 asserts WL(0) and the mode indication is 1, indicating a group size of two. In the situation (b) the read signals from the memory cells 1100, 1110 are combined on the bit lines to provide a combined read signal to the common sense amplifier 1120.

As mentioned above, one aspect of operating in a mode having a higher group size is that the capacity of the memory circuit to store useful data is lower than would be the case if a mode having a smaller group size were used. In an arrangement which allows the mode and therefore the group size to be changed dynamically, for example in response to or as part of a change in operating voltage, techniques can be provided to take into account the fact that a change from a smaller group size to a larger group size will bring a reduction in useful capacity of the memory circuit to store data.

Figure 12:
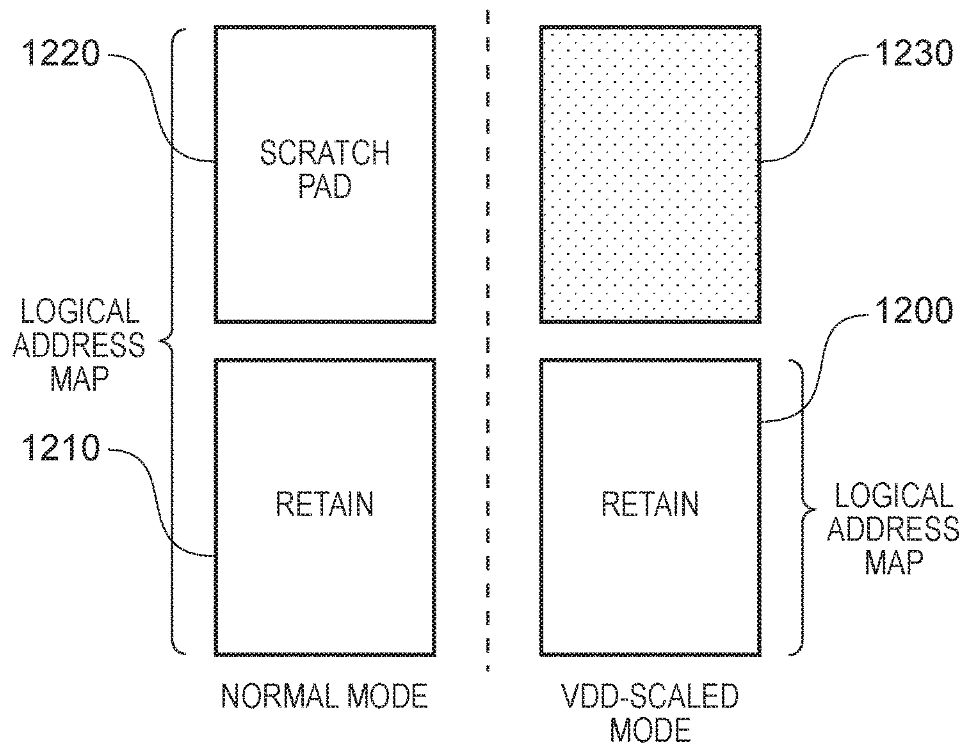
FIG. 12 schematically illustrates a memory map in two different modes.

FIG. 12 provides an example of a memory map relating logical addresses within the data storage capacity of a memory circuit to the contents stored in those addresses in two different modes, a normal mode (for example, group size=1) and a VDD-scaled mode (for example, group size=2). In the VDD-scaled mode on the right hand side of FIG. 12, the available set of logical memory addresses is half that available in the normal mode.

An example way of dealing with this is to treat the range of logical addresses 1200 available in the VDD-scaled mode as a memory area 1210 in the normal mode which will definitely be retained even in the instance of a change of mode from the normal mode to the VDD-scaled mode. The remaining portion 1220 of the range of logical addresses available in the normal mode is treated as a so-called scratch pad or similar memory area used to store temporary data which does not need to be retained beyond the extent of a localised set of processing operations. In this way, useful data which requires retention is not lost in the situation of a change from the normal mode to the VDD-scaled mode.

In other examples, the memory area 1220 can be written to other storage such as hard disk storage or the like in the event of a change from the normal mode to the VDD-scaled mode.

In the VDD-scaled mode, the memory areas which are now unavailable (a shaded area 1230 in FIG. 12) should, at the time that they are subsequently read, contain corresponding data to the useful logical address map 1200. In other words, memory cells corresponding to the memory area 1230 form part of respective groups with corresponding memory cells in the addressable area 1200 such that each addressable bit is represented by two memory cells which are read in common in the manner described above. FIG. 12, in conjunction with FIGS. 8 and 9 above, provides an example of address decoding circuitry 800, 900 to map data storage elements to memory addresses, the address decoding circuitry and the control circuitry cooperating, in the second mode of operation (or more generally in a mode of operation having a group size greater than one), to map each group of data storage elements to the same memory address.

Figure 13:
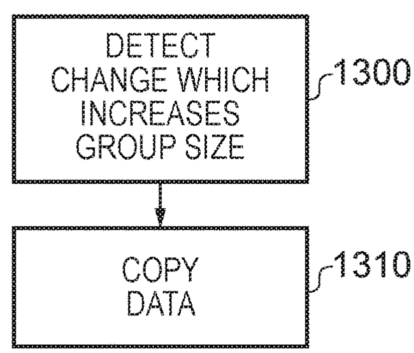
FIGS. 13 and 14 are schematic flowcharts illustrating respective techniques for handling a change in group size.
Figure 14:
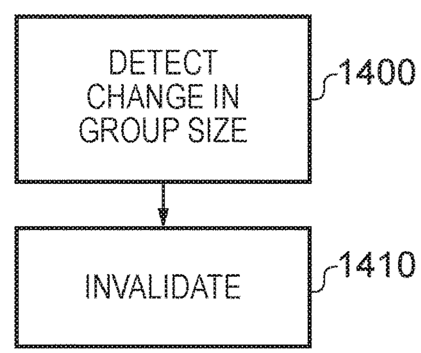

Any write accesses in the new mode having the higher group size are made to all memory cells in the relevant group, using the same type of addressing techniques discussed in connection with FIGS. 8 to 11. This provides an example of the control circuitry 530 being configured, in respect of a write operation to write a data bit to a given data storage element, to control writing of that data bit to all of the data storage elements in the group containing the given data storage element. However, FIGS. 13 and 14 provide examples of how this duplication of data can be achieved or handled in respect of data already present in the memory. The flowcharts of FIGS. 13 and 14 provide examples of the type of changes which might be initiated in response to the step 710 of FIG. 7 discussed above.

In FIG. 13, at a step 1300 a change is detected which increases the group size. An example might be a change from the normal mode at the left hand side of FIG. 12 to the VDD-scaled mode at the right hand side of FIG. 12. As mentioned above, in the VDD-scaled mode, each addressable data bit is now represented by two memory cells which should contain the same stored bit. Therefore, for each memory address which can still be accessed (the area 1200 of FIG. 12), the contents of memory cells in that area are copied to the corresponding memory cells forming the other part of the group which will be in place once the mode change has occurred. This copy operation is represented by a step 1310 in FIG. 13. As discussed in connection with FIG. 7, this change is carried out before operation in the new (VDD-scaled) mode is instructed at the step 730. The step 1310 provides an example of which the control circuitry being configured, in response to initiation of a transition from the first mode to the second mode, to control copying of data bits stored by some of the data storage elements so that, for each group of data storage elements in the second mode, the data storage elements of the group store the same data bit.

Figure 15:
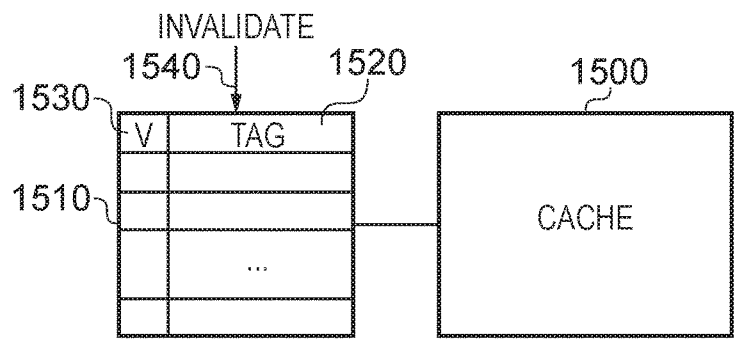
FIG. 15 schematically illustrates a cache invalidation operation.

An alternative is illustrated in the schematic flowchart of FIG. 14 in connection with a type of memory arrangement shown schematically in FIG. 15. In this example, the memory has associated information indicating whether data stored at particular addresses is valid or invalid. An example is a cache memory 1500 having an associated “tag” memory 1510 in which tags 1520 having corresponding validity flags 1530 indicate the contents of the cache memory 1500. Returning to FIG. 14, at a step 1400, a change in group size is detected (corresponding to the step 710 of FIG. 7). This could be a change which increases or decreases the group size. At a step 1410, an invalidate instruction 1540 is provided to the tag memory 1510 to cause all of the validity flags 1530 to be set to “invalid”. This forces the situation that any data which can validly be read from the memory will have been written to the memory under the new mode, that is to say, according to the new group size. As mentioned above, such data is written to all memory cells in the group.

FIGS. 14 and 15 therefore provide an example of the data storage elements being associated with information indicating whether valid data is currently stored by those data storage elements; and the control circuitry being configured, in response to initiation of a transition in which the group size changes, to set the associated information to indicate that valid data is not currently stored by the data storage elements.

Figure 16:
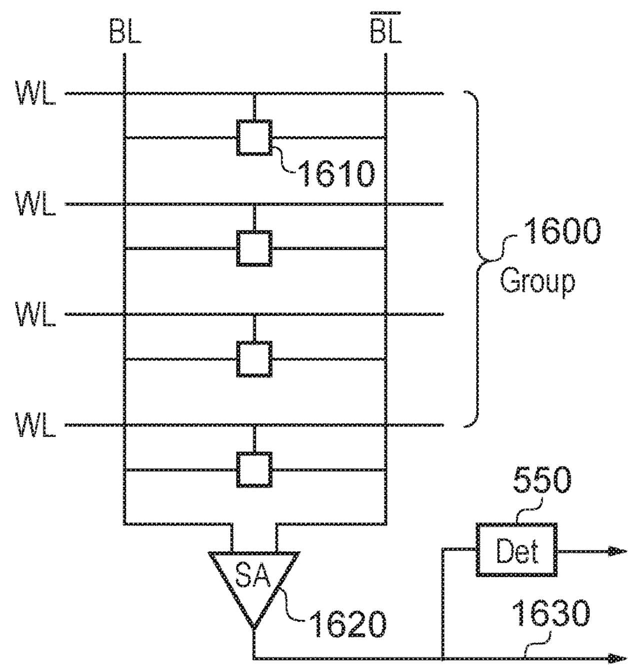
FIG. 16 schematically illustrates circuitry used to read a group of more than two memory elements.

FIG. 16 schematically illustrates an example arrangement of a group 1600 of memory cells 1610 in which four memory cells connected to common bit lines are enabled in common as a single group. In other words, the group size is four.

Where a group size of four is in use, it may be that the supply voltage for the memory circuit is quite low. It may indeed be that the supply voltage is sufficiently low that the reliable operation of the memory cells can be affected in some cases. An aspect of the arrangement of FIG. 16, therefore, is that the combination of the read signals for detection by a common sense amplifier 1620 can provide a majority voting or averaging process such that the data bit 1630 output by the sense amplifier 1620 will tend to reflect the majority of the four memory cells 1610 in the group so that if one memory cell disagrees with the other three, a valid output may still be obtained. In this way, the simple use of a group size of greater than two can bring the additional advantage of a majority-based error correction in the situation where memory cells disagree as to their stored data bit.

A further possible aspect of the arrangement of FIG. 16 is the use of the detector 550 mentioned in connection with FIG. 5. As discussed above, this is an optional feature of the circuitry of FIG. 5 but its use will be discussed in more detail here.

In general terms, the detector 550 can be arranged to detect potential discrepancies between the output of memory cells in a group such as that shown in FIG. 16. An example of the way in which such a detection may be used will be described with reference to the flowchart of FIG. 20 below.

Figure 17:
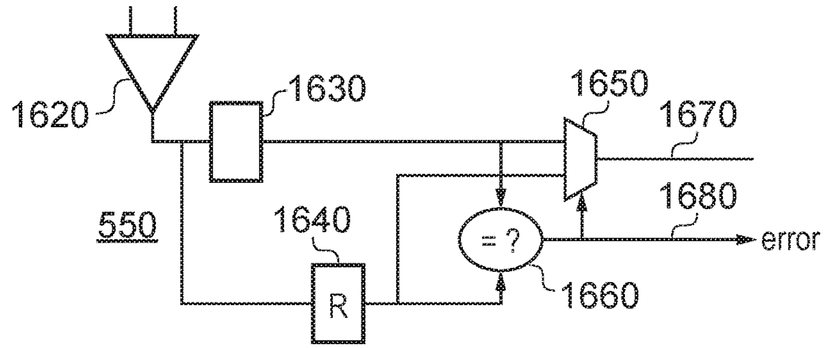
FIG. 17 schematically illustrates detection circuitry.
Figure 18:
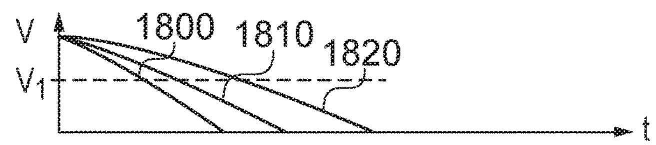
FIG. 18 is a schematic graph of read voltage against time.
Figure 19:
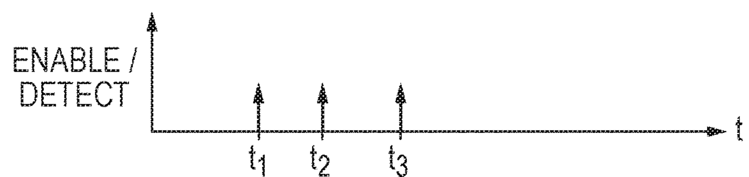
FIG. 19 schematically illustrates multiple detection instants.

FIG. 17 provides a more detailed example of such a detector. Its operation is based upon the realisation that the time taken for the appropriate one of the bit lines to settle to a detectable voltage (in this example, to be pulled low) can vary if there are discrepancies between the output provided by the memory cells 1610 in the group. If all of the memory cells 1610 are pulling the relevant bit line the same way, this will tend to give a faster attainment of a detectable output bit than if, say, three memory cells are pulling the bit line down and one is attempting to hold the bit line at a high voltage. So, a detection of the speed at which the relevant bit line settles to a detectable output bit can indicate the presence of discrepancies within the group 1600. Examples are shown schematically in FIGS. 18 and 19. FIG. 18 illustrates the progression, with respect to time, of the voltage on the relevant one of the bit lines which is being pulled low, showing that the voltage drops more quickly (a curve 1800) in an instance of no discrepancies, compared to a slower change (curves 1810 or 1820) in the case of discrepancies between the memory cells in the group. The sense amplifier is arranged to detect the voltage on one bit line dropping below a threshold voltage $V_1$ and so the period taken for a reliable detection may vary according to whether discrepancies are present.

If, the voltage detected by the sense amplifier is following the curve 1810 or the curve 1820, then it may be that the detection made at the time $t_1$ after initiation of the read operation is unreliable, and in particular that its outcome is different to a subsequent detection made at a time $t_2$ and/or $t_3$ after initiation of the read operation.

So, if there are no discrepancies in the signals being provided by the multiple memory cells 1610 in the group, the detections made by the sense amplifier at the times $t_1$, $t_2$ (and optionally $t_3$) will all be the same. If there are discrepancies amongst the memory cells in the group 1600, these detections may be different. In such instances, (a) the later detection may be treated as the more reliable detection, and (b) a discrepancy is detected.

Referring back to FIG. 17, the output of the sense amplifier 1620 is provided to a non-delaying latch 1630 and also to a delay element 1640. The output of the delay element 1640 and the output of the non-delaying latch 1630 are both provided to a multiplexer 1650 and to a comparator 1660. Therefore, the output of the delay element 1640 can represent an early detection (for example, at the time $t_1$) which is then delayed to be compared with a later detection (for example, at the time $t_2$). If the comparator detects that the two detections are the same then the multiplexer can pass either of them as an output signal 1670. An alternative output signal could be the initial detection, which is to say the input to the delay element 1640, if a faster but potentially less reliable detection is required. In such a case, if a discrepancy is detected in respect of that detection, the detection could be arranged to cause subsequent processing of the read data to be restarted using the later-detected data.

If, however, the comparator 1660 detects that these two detections are different then the multiplexer 1650 is controlled to pass the later one of the detections as an output signal. The comparator 1660 also outputs an error signal 1680 indicative of an instance of a discrepancy.

The detector 550 therefore provides an example of detection circuitry to detect instances of discrepancies between data bits stored by data storage elements in a group of data storage elements, and in which (see FIG. 20 below) the power controller is configured to control the operating voltage of the circuit in dependence upon the instances of discrepancies detected by the detection circuitry. The detector as described provides an example of the detection circuitry is configured to detect a time taken for the read circuitry to read a data bit, in an example context that the access circuitry comprises read circuitry. In particular the detector 550 provides an example of detecting the polarity of a data bit generated by the read circuitry differs between a first instant (such as $t_1$) after initiation of a read operation and a second, later, time instant (such as $t_2$ and/or $t_3$) after initiation of the read operation.

Figure 20:
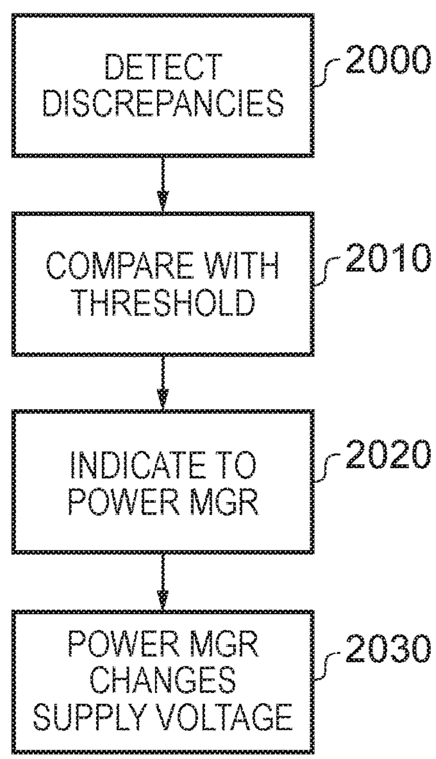
FIG. 20 is a schematic flowchart illustrating a discrepancy detection technique.

FIG. 20 schematically illustrates a process which can be carried out by the power manager and/or the CPU in response to discrepancies detected by the detector 550.

A step 2000 represents the detection of discrepancies as discussed above.

At a step 2010, the rate and/or absolute number of discrepancies is compared with a threshold rate or number.

A step 2020 represents the CPU 500 indicating to the power manager whether or not the threshold has been exceeded. In response to that indication, at a step 2030, the power manager can change the supply voltage provided to the memory circuit.

In this way, if the detection indicates that a high rate of discrepancies is being detected amongst memory cells in the group, this could indicate that the memory circuit would operate more reliably at a slightly higher supply voltage. The power manager can therefore change the supply voltage to increase it slightly without necessarily changing the group size, so as to provide more reliable operation at the current group size. Similarly, optionally the power manager could reduce the supply voltage slightly if it is detected that fewer than a lower threshold number or rate of discrepancies are being obtained. Therefore, more than one threshold can be used at the step 2010, or a continuous range of power manager responses to the detector rate or number of discrepancies could be provided.

Figure 21:
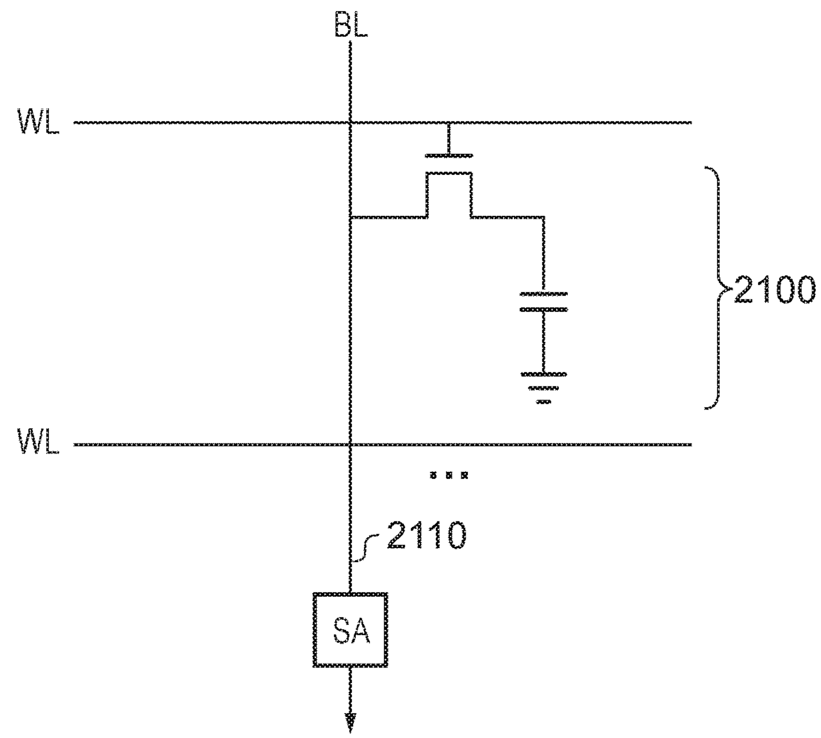
FIG. 21 schematically illustrates a single-ended memory cell.

The discussion above has related to SRAM memory cells having two bit lines for each column of cells. The arrangements are also suited to dynamic random access memory (DRAM) cells such as a cell 2100 in FIG. 21 having a single bit line 2110 applicable to each column of memory cells.

Figure 22:
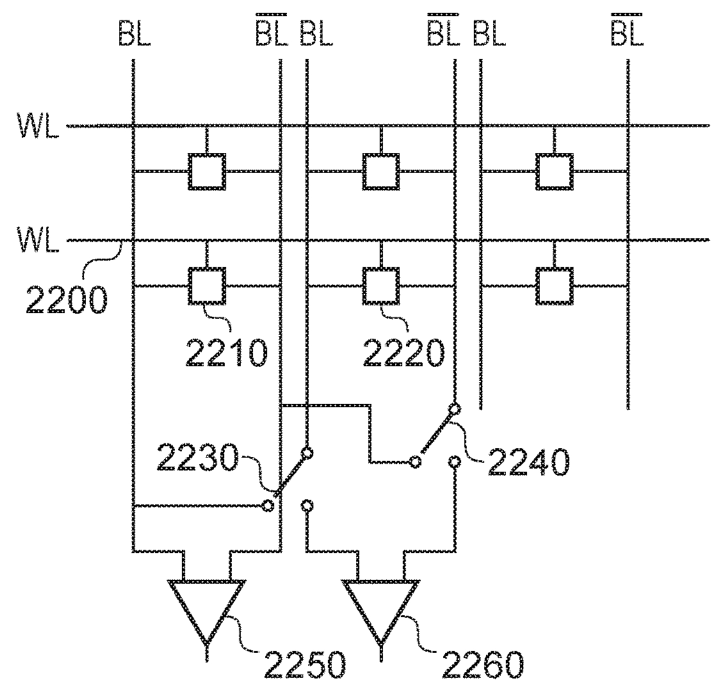
FIG. 22 schematically illustrates an array of data storage elements.

Similarly, the discussion above has related to the grouping of memory cells by column so that in order to form a group, multiple word lines are enabled and corresponding cells in a column provide their read signals to the sense amplifier applicable to that column. FIG. 22 shows another arrangement in which the grouping is carried out across rows of memory cells. In order to form a group of, say, two memory cells, a single word line 2200 is enabled and cells 2210, 2220 are formed into a group by routing circuitry comprising switches 2230, 2240. When the group size is one, the switches 2230, 2240 direct the read signals from the cell 2210 to a sense amplifier 2250 and direct the read signals from the cell 2220 to a sense amplifier 2260. When a group size of two is required, the switches 2230, 2240 direct the read signals from the cells 2210, 2220 to the single sense amplifier 2250.

Combinations of row-based grouping and column-based grouping can be provided, for example grouping together a square array of four cells, two columns wide by two rows tall.

Figure 23:
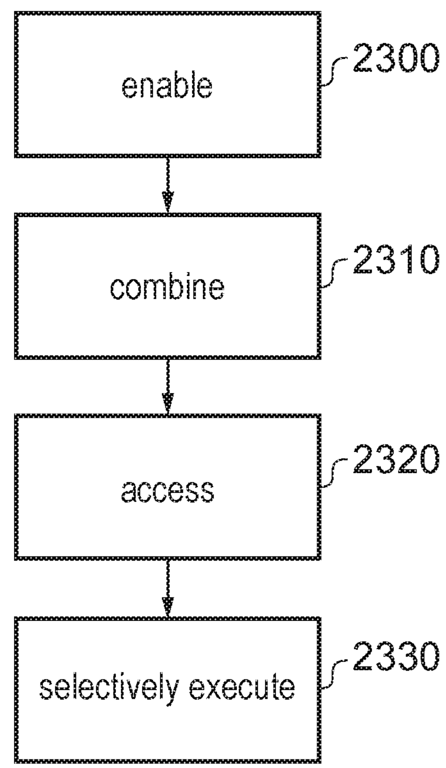
FIG. 23 is a schematic flowchart illustrating a method.

FIG. 23 is a schematic flowchart illustrating a method such as a method of operation of a memory circuit (applicable to embodiments discussed above and discussed below), the method comprising:

enabling, at a step 2300, groups of data storage elements of an array of data storage elements for access, the groups having a group size, the group size being one or more;

combining, at a step 2310, access signals for data storage elements in a group (for example, read signals output by data storage elements in a group) to provide a combined access signal;

accessing, at a step 2320, a group of data storage elements by a common access signal for data storage elements of the group (for example, by reading a data bit by detecting the common read signal output by that data storage elements of the group in response to those data storage element being enabled for read access); and selectively executing, at a step 2330, the enabling (2300), combining (2310) and reading (2320) steps in at least a first mode and a second mode, the group size in the first mode being different to the group size in the second mode.

Figure 24:
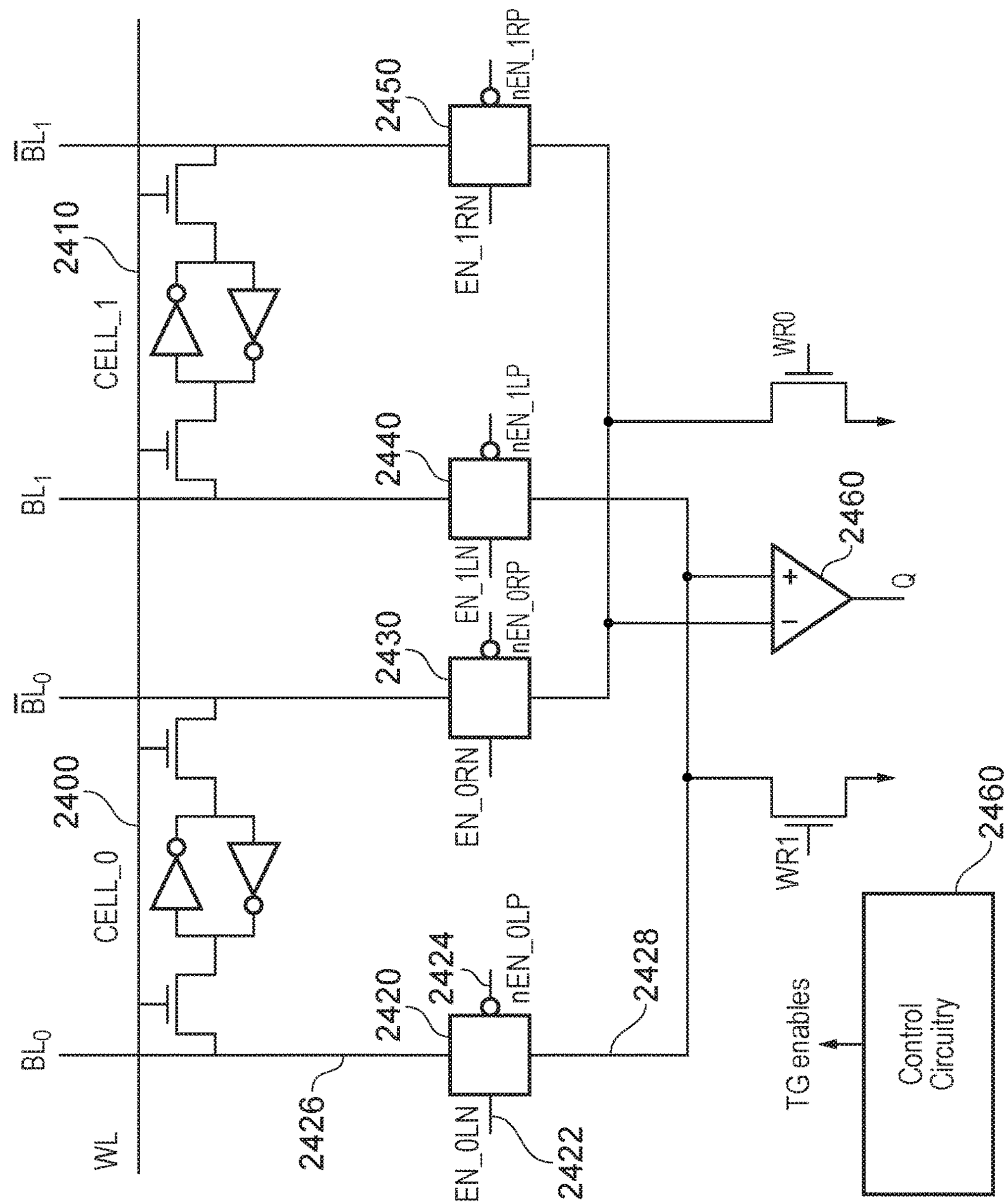
FIG. 24 schematically illustrates a memory circuit.

FIG. 24 schematically illustrates a memory circuit representing an example arrangement in which the access circuitry comprises write circuitry configured to write a data bit to a data storage element by providing a write signal to that data storage element; and the control circuitry is configured, in respect of a write operation to write a data bit to a given data storage element, to control writing of that data bit to all of the data storage elements in the group containing the given data storage element.

FIG. 24 shows an example arrangement where two columns of example SRAM 6T bit-cells (memory cells) 2400, 2410 are interfaced using a transmission-gate multiplex structure for both reads and writes.

A transmission gate (such as transmission gates 2420, 2430, 2440, 2450) has complementary control inputs (shown as 2422, 2424 on the transmission gate 2420). Depending on the state of control signals supplied (for example, by control circuitry 2460, for example forming at least a part of the control circuitry 530 discussed above) to the complementary control inputs, the transmission gate 2420 can either isolate two input/output ports 2426, 2428 or provide a connection between them. The other transmission gates 2430-2450 operate in a similar way.

For a data bit to be written to the memory cell 2400, the write line WL is asserted, transmission gates 2420 and 2430 are opened (indicating that the two input/output ports are connected together for each transmission gate) and the value written into the memory cell 2400 depending on which of two write signals WR1 and WR0 is enabled. In a mode having a mode size of one (or at least a mode in which the memory cell 2410 is not part of a group with the memory cell 2400) the transmission gates 2430, 2440 would remain shut (indicating that the two input/output ports are not connected together for each transmission gate). The assertion of the write line WL with the transmission gates 2430, 2440 shut would provide an operation similar to a read operation for the memory cell 2410, but without any read sensing taking place. For this reason it could be referred to as a "dummy read" operation.

Operation at a group size of two (or more), encompassing at least the memory cells 2400, 2410 in a single group, will now be described. The cells 2400, 2420 are grouped such all of the columns within such a group (for which the respective WL is enabled) are combined together and are written together. This can be achieved by opening all four transmission gates 2420 . . . 2450 for a write operation, under the control of the control circuitry 2460. For write operations this allows a single word-line voltage to be applied for the duration of the write process, as the state in both cells will be overwritten.

For read access, the WL is asserted and the transmission gates opened (which could mean (i) the transmission gates 2420, 2430 to read from the memory cell 2400, (ii) the transmission gates 2440, 2450 to read from the memory cell 2410, or (iii) all four transmission gates to read from a group including both memory cells 2400, 2410). The read signals on the bit lines appropriate to the cells are routed to a sense amplified 2460 to generate an output data bit.

Note that the arrangement of FIG. 24 illustrates a group comprising multiple memory cells in the same row. Earlier-discussed examples related to groups comprising multiple memory cells in the same column. These techniques can be combined, for example to implement a rectangular array of memory cells in a group (for example, a 2×2 array).

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device (such as the processing element 12) may be programmed to perform the function. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

What is claimed is:

1. A memory circuit comprising:

an array of data storage elements;

access circuitry to access a data bit, stored by a data storage element enabled for access, by an access signal for that data storage element; and control circuitry to enable groups of data storage elements for access, the groups having a group size, the group size being one or more, the access signals for data storage elements in a group being combined to provide a combined access signal common to that group of data storage elements;

the control circuitry being configured to operate in at least a first mode and a second mode, the group size in the first mode being different to the group size in the second mode, and being configured to operate in the first mode or the second mode in dependence upon a power supply voltage provided to the circuit.

2. A circuit according to claim 1, in which the group size is greater in the second mode than in the first mode.

3. A circuit according to claim 2, in which the group size is one in the first mode, and the group size is greater than one in the second mode.

4. A circuit according to claim 1, in which:

the access circuitry comprises write circuitry configured to write a data bit to a data storage element by providing a write signal to that data storage element; and the control circuitry is configured, in respect of a write operation to write a data bit to a given data storage element, to control writing of that data bit to all of the data storage elements in the group containing the given data storage element.

5. A circuit according to claim 1, comprising address decoding circuitry to map data storage elements to memory addresses, the address decoding circuitry and the control circuitry cooperating, in a mode of operation having a group size greater than one, to map each group of data storage elements to the same memory address.

6. A circuit according to claim 1, in which the control circuitry is configured to operate in the second mode in response to a lower power supply voltage and to operate in the first mode in response to a higher power supply voltage.

7. A circuit according to claim 1, in which the access circuitry comprises read circuitry configured to read a data bit stored by a data storage element by detecting a read signal output by that data storage element; and for a group of data storage elements enabled for access, the read signals output by data storage elements in the group are combined to provide a combined read signal for detection by read circuitry common to the group of data storage elements.

8. A circuit comprising:

an array of data storage elements;

access circuitry to access a data bit, stored by a data storage element enabled for access, by an access signal for that data storage element; and control circuitry to enable groups of data storage elements for access, the groups having a group size, the group size being one or more, the access signals for data storage elements in a group being combined to provide a combined access signal common to that group of data storage elements;

the control circuitry being configured to operate in at least a first mode and a second mode, wherein the group size is greater in the second mode than in the first mode, and wherein the control circuitry is configured, in response to initiation of a transition from the first mode to the second mode, to control copying of data bits stored by some of the data storage elements so that, for each group of data storage elements in the second mode, the data storage elements of the group store the same data bit.

9. A circuit comprising:

an array of data storage elements;

access circuitry to access a data bit, stored by a data storage element enabled for access, by an access signal for that data storage element;

wherein the data storage elements are associated with information indicating whether valid data is currently stored by those data storage elements; and control circuitry to enable groups of data storage elements for access, the groups having a group size, the group size being one or more, the access signals for data storage elements in a group being combined to provide a combined access signal common to that group of data storage elements;

the control circuitry being configured to operate in at least a first mode and a second mode, the group size in the first mode being different to the group size in the second mode, and wherein the control circuitry is configured, in response to initiation of a transition in which the group size changes, to set the associated information to indicate that valid data is not currently stored by the data storage elements.

10. A circuit according to claim 1, comprising:

a first array of control lines connected to the array of data storage elements, by which a control line of the first array of control lines enables a respective subset of the data storage elements; and a second array of control lines to connect a given access circuitry to a plurality of data storage elements comprising a data storage element in each enabled subset so as to connect that given access circuitry to data storage elements in the plurality of data storage elements.

11. A circuit according to claim 10, in which:

the array of data storage elements comprises plural rows and plural columns of data storage elements;

control lines in the first array are configured to enable rows of data storage elements; and control lines in the second array of control lines are associated with columns of the data storage elements.

12. A circuit according to claim 10, in which the control circuitry is configured to enable a group of data storage elements for access by asserting two or more control lines of the first array.

13. A circuit according to claim 1, in which the control circuitry is configured to operate in three or more modes each having a different respective group size.

14. A data processing system comprising:

a memory circuit comprising:

an array of data storage elements;

access circuitry to access a data bit, stored by a data storage element enabled for access, by an access signal for that data storage element; and control circuitry to enable groups of data storage elements for access, the groups having a group size, the group size being one or more, the access signals for data storage elements in a group being combined to provide a combined access signal common to that group of data storage elements;

the control circuitry being configured to selectively operate in at least a first mode and a second mode, the group size in the first mode being different to the group size in the second mode; and a power controller configured to provide a power supply voltage to the circuit, and to provide a mode indication, indicative of the first mode or the second mode, to the control circuitry, in dependence upon the power supply voltage.

15. A system according to claim 14, comprising detection circuitry to detect instances of discrepancies between data bits stored by data storage elements in a group of data storage elements, and in which the power controller is configured to control the operating voltage of the circuit in dependence upon the instances of discrepancies detected by the detection circuitry.

16. A system according to claim 15, in which:

the access circuitry comprises read circuitry; and the detection circuitry is configured to detect a time taken for the read circuitry to read a data bit.

17. A system according to claim 16, in which the detection circuitry is configured to detect the polarity of a data bit generated by the read circuitry differs between a first instant after initiation of a read operation and a second, later, time instant after initiation of the read operation.

18. A method comprising:

enabling groups of data storage elements of an array of data storage elements for access, the groups having a group size, the group size being one or more;

combining access signals for data storage elements in a group to provide a combined access signal;

accessing a group of data storage elements by a common access signal for data storage elements of the group; and selectively executing the enabling, combining and reading steps in at least a first mode and a second mode in dependence upon a power supply voltage provided to the array of data storage elements, the group size in the first mode being different to the group size in the second mode.

* * * * *

UNITED STATES PATENT AND TRADEMARK OFFICE

CERTIFICATE OF CORRECTION

PATENT NO. : 9,786,362 B1
APPLICATION NO. : 15/248335
DATED : October 10, 2017
INVENTOR(S) : Shidhartha Das et al.

It is certified that error appears in the above-identified patent and that said Letters Patent is hereby corrected as shown below:

In the Specification

Column 2, Line 18: please delete “reading” and insert -- accessing --.

Column 6, Line 5: please delete “reading” and insert -- accessing --.

Column 16, Line 30: please delete “reading” and insert -- accessing --.

Column 20, Line 38: please delete “reading” and insert -- accessing --.

Signed and Sealed this
Thirteenth Day of March, 2018

Andrei Iancu
*Director of the United States Patent and Trademark Office*